United States Patent
Barth, Jr. et al.

(10) Patent No.: US 6,766,468 B2
(45) Date of Patent: Jul. 20, 2004

(54) MEMORY BIST AND REPAIR

(75) Inventors: John E. Barth, Jr., Williston, VT (US);
Jeffrey H. Dreibelbis, Williston, VT (US); Michael R. Ouellette, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 374 days.

(21) Appl. No.: 09/682,023

(22) Filed: Jul. 11, 2001

(65) Prior Publication Data

US 2003/0014686 A1 Jan. 16, 2003

(51) Int. Cl.[7] .................................................. H02H 3/05
(52) U.S. Cl. .............................................. 714/7; 714/30
(58) Field of Search .............................. 714/7, 8, 29, 30, 714/42, 710, 718, 720, 725, 733, 734, 766, 769

(56) References Cited

U.S. PATENT DOCUMENTS

| | | | |
|---|---|---|---|
| 4,817,093 A | | 3/1989 | Jacobs et al. |
| 4,903,266 A | | 2/1990 | Hack |
| 5,301,156 A | | 4/1994 | Talley |
| 5,577,050 A | | 11/1996 | Bair et al. |
| 5,910,921 A | | 6/1999 | Beffa et al. |
| 5,917,764 A | * | 6/1999 | Ohsawa et al. ............. 365/200 |
| 5,920,515 A | * | 7/1999 | Shaik et al. ................ 365/200 |
| 5,961,653 A | | 10/1999 | Kalter et al. |
| 5,987,632 A | * | 11/1999 | Irrinki et al. ............... 714/711 |
| 6,032,264 A | | 2/2000 | Beffa et al. |
| 6,065,134 A | | 5/2000 | Bair et al. |
| 6,085,334 A | * | 7/2000 | Giles et al. .................... 714/7 |
| 6,119,251 A | | 9/2000 | Cloud et al. |
| 6,321,320 B1 | * | 11/2001 | Fleischman et al. ........ 711/217 |
| 6,510,398 B1 | * | 1/2003 | Kundu et al. ............... 702/117 |

* cited by examiner

Primary Examiner—Dieu-Minh Le
(74) Attorney, Agent, or Firm—Scully, Scott, Murphy & Presser; Robert A. Walsh, Esq.

(57) ABSTRACT

A method of memory BIST (Built-In Self Test) and memory repair that stores a redundancy calculation on-chip, as opposed to scanning this data off-chip for later use. This method no longer requires level-sensitive scan design (LSSD) scanning of memory redundancy data off-chip to the tester, and therefore does not require re-contacting of the chip for electrical fuse blow.

6 Claims, 3 Drawing Sheets

MEMORY BIST AND REPAIR

BACKGROUND OF THE INVENTION

1. Field of the Invention

The present invention relates generally to a memory BIST (Built-In Self Test) and repair, and more particularly pertains to a memory BIST and repair which stores redundancy data on-chip to allow redundancy to be activated during wafer test or to be used to select fuses for permanent enablement (i.e. for e-fuses, which are electrically-blown fuses).

The present invention provides a method of memory BIST (Built-In Self Test) and memory repair that stores a redundancy calculation on-chip, as opposed to scanning this data off-chip for later use. This method no longer requires level-sensitive scan design (LSSD) scanning of memory redundancy data off-chip to the tester, and therefore does not require re-contacting of the chip for electrical fuse blow.

2. Discussion of the Prior Art

Memory BIST and repair is commonly used in memory designs as a means of increasing product yield. BIST and repair schemes in the prior art generally require that the failing bit/word be LSSD (level-sensitive scan design) scanned off-chip or to an on-chip processor to determine fixability of the memory cells and for fuse blow identification.

FIG. 1 illustrates a prior art BIST and repair scheme which requires that the failing bit/word be LSSD scanned off-chip or to an on-chip processor to determine fixability of the memory cells and for fuse blow identification. Also, see U.S. Pat. No. 5,961,653 as an example

SUMMARY OF THE INVENTION

Accordingly, it is a primary object of the present invention to provide a memory BIST and repair.

A further object of the subject invention is the provision of a memory BIST and repair which stores redundancy data on-chip to allow redundancy to be activated during wafer test or to be used to select fuses for permanent enablement (i.e. for e-fuses).

In accordance with the teachings herein, the present invention provides a method of storing memory redundancy allocation signatures for memory elements, such as memory blocks or banks, on-chip. Pursuant to the method, each memory element capable of redundancy on the chip is interrogated, one at a time using a built-in self test program. A redundancy allocation signature is then stored on the chip for each memory element from said built-in self test program, and redundancy is enabled for each memory element by interpreting the stored redundancy allocation signature for that memory element.

BRIEF DESCRIPTION OF THE DRAWINGS

The foregoing objects and advantages of the present invention for a memory BIST and repair may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE INVENTION

Figure 1:
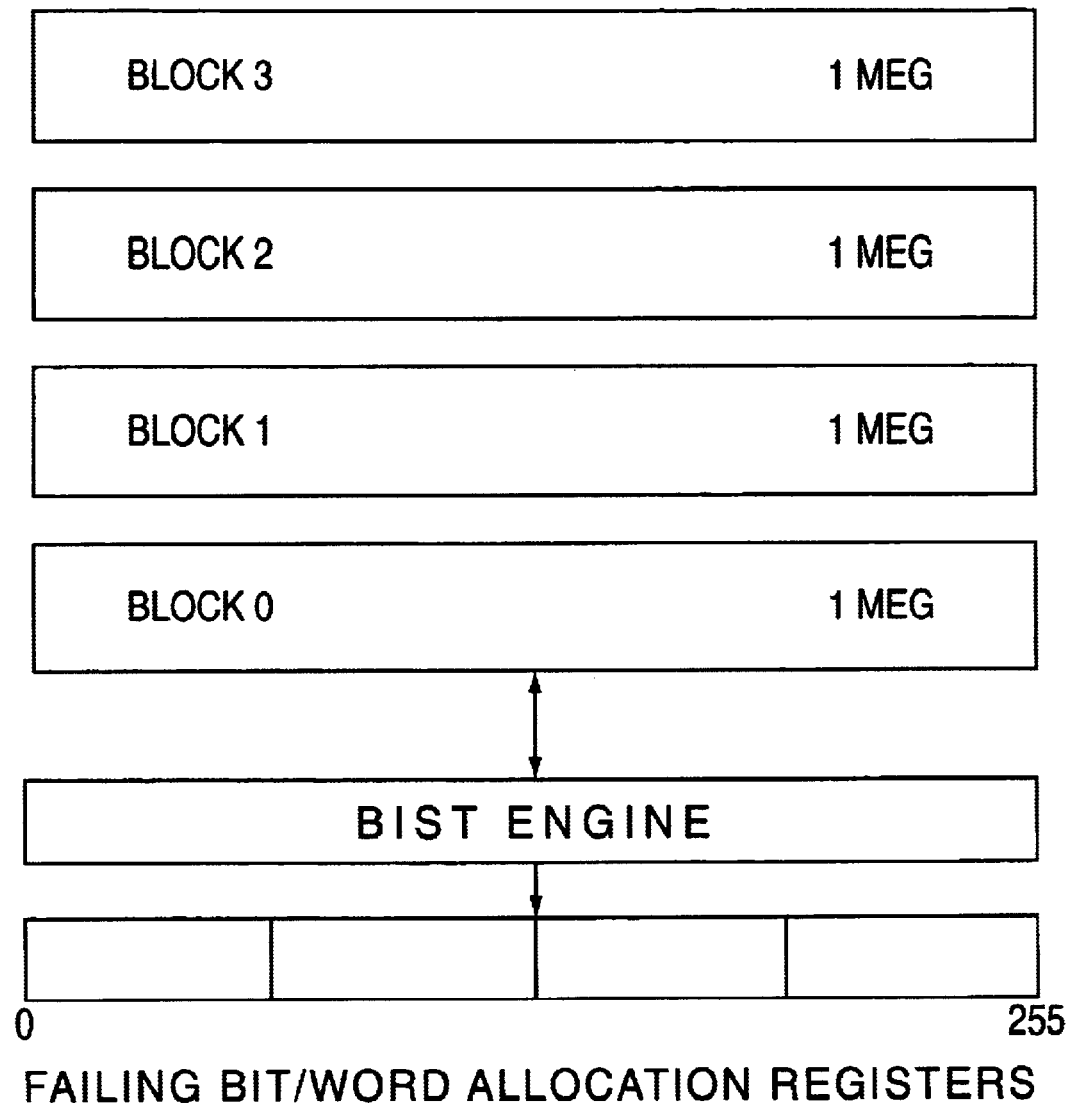
FIG. 1 illustrates a prior art BIST and repair scheme which requires that the failing bit/word be LSSD scanned off-chip or to an on-chip processor to determine fixability of the memory cells and for fuse blow identification.
Figure 2:
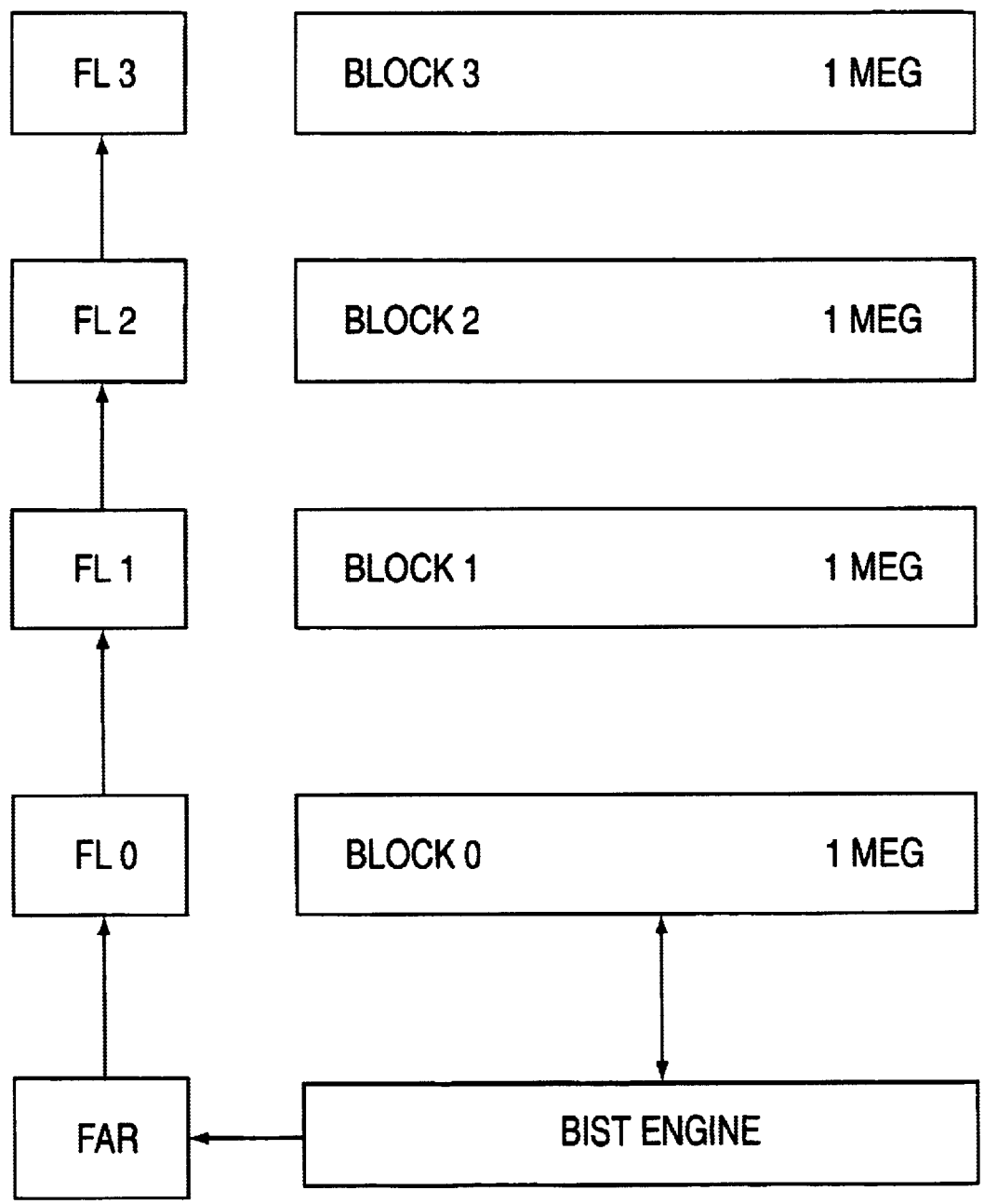
FIG. 2 illustrates an embedded memory portion of a generic semiconductor IC (SRAM, embedded DRAM, etc) which is being subjected to a method of memory BIST and repair pursuant to the present invention.

FIG. 2 illustrates an embedded memory portion of a generic semiconductor IC (SRAM, embedded DRAM, etc) which is being subjected to a method of memory BIST and repair pursuant to the present invention. An embedded memory is a memory which is connected with logic circuits in an integral manner on the chip, and is distinguished from a stand alone memory chip which is more easy to access and repair. The embedded memory of FIG. 2 comprises four 1 Meg memory blocks. A typical 1 Meg memory block might have 8 redundant columns and 8 redundant rows provided for memory repair.

Each memory block is testable via a BIST engine and contains redundancy block(s). The BIST engine interrogates each 1 Meg memory block, one at a time, and produces a redundancy allocation signature based upon the interrogation which describes an optimized memory repair for that memory block designating replacement redundant memory cells, columns, rows, etc. to be substituted for faulty memory cells, columns, rows, etc. in the memory block. The redundancy allocation signature is then shifted into the FAR (Fuse Address Register). The redundancy allocation signature provides redundancy allocation information for the failing portions of each 1 Meg memory block.

Figure 3:
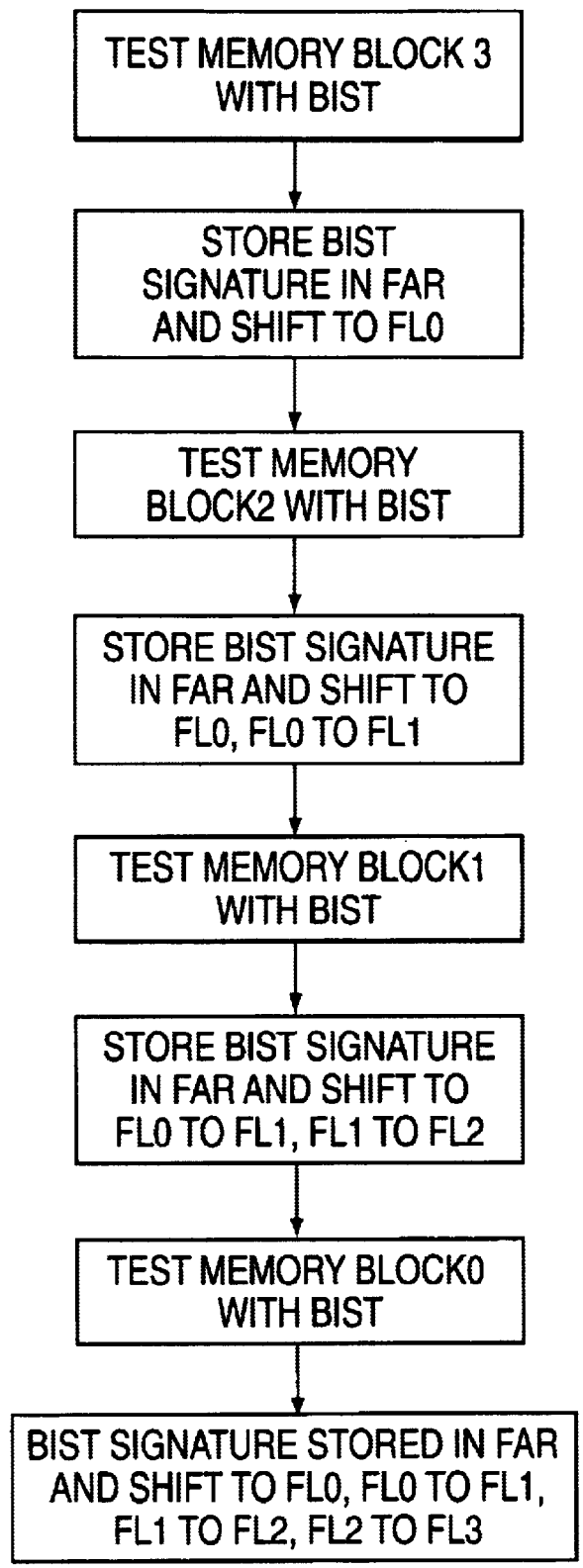
FIG. 3 illustrates a logic flow diagram of one embodiment of a method of memory BIST and repair pursuant to the present invention.

FIG. 3 illustrates a logic flow diagram of one embodiment of a method of memory BIST and repair pursuant to the present invention.

Memory block3 is tested first by the BIST engine. The redundancy allocation signature for memory block3 is then stored in the FAR and then shifted into the FL0 (Fuse Latch0).

Memory block2 is then interrogated using the same process. The redundancy allocation signature for memory block2 is stored in the FAR and is then shifted to the FL0, and the contents of the FL0 (memory block3 redundancy allocation signature) is shifted into FL1.

Memory block1 is interrogated next. The redundancy allocation signature for memory block1 is stored in the FAR and is then shifted into the FL0, the contents of the FL0 (memory block2 redundancy allocation signature) is shifted into the FL1, and the contents of the FL1 (memory block3 redundancy allocation signature) is shifted into the FL2.

Memory block0 is interrogated last. The redundancy allocation signature for memory block0 is stored in the FAR and then shifted into the FL0. The contents of the FL0 (memory block1 redundancy allocation signature) is shifted into the FL1, the contents of the FL1 (memory block2 redundancy allocation signature) is shifted into the FL2, and the contents of the FL2 (memory block3 redundancy allocation signature) is shifted into the FL3.

It is important to note that, for the above described embodiment to work properly, the outputs of the FL0–3 latches must be masked from implementing repairs to the Memory blocks until testing of all Memory blocks is complete, and the FAR data is completely shifted to it's final destination. This "masking" could most simply be accomplished by sending the output of each FL latch through a 2-input AND gate. The other input of all the masking 2-input AND gates would be connected to a single control line that would, upon completion of the BIST, enable the redundancy solution to implement the repairs to each Memory section. In this way, it is guaranteed, through the use of the masking function, that the testing is performed upon the entirety of normal address space, such that the repair data is ignored until all testing is complete.

At this point, each memory block has been interrogated by the BIST engine, and each block's redundancy allocation signature is stored in its respective fuse latch FL. Each fuse latch FL can then be accessed and used to enable redundancy allocation or to steer fuse-blow current/voltage for fuse activation (i.e. electronic fuse blow) on each Memory block.

It should be obvious to those skilled in the art that this specific example could be extended to cover any number of memory blocks and sizes in alternative embodiments.

The present invention provides the ability to store memory redundancy allocation signature on-chip in existing storage elements.

While several embodiments and variations of the present invention for a memory BIST and repair are described in detail herein, it should be apparent that the disclosure and teachings of the present invention will suggest many alternative designs to those skilled in the art.

What is claimed is:

1. A method of storing memory redundancy allocation signatures for separate memory blocks of a memory, on-chip, comprising:

interrogating each separate memory block, wherein each separate memory block comprises a plurality of memory cells arranged in a plurality of rows and columns, capable of redundancy on a chip, one memory block at a time, using a built-in self test (BIST) engine;

providing a separate fuse storage for each separate memory block and a single fuse address register (FAR) which is shared between the separate memory blocks during testing by the BIST engine, wherein each memory block is tested by the BIST engine, and a redundancy allocation signature for that memory block is stored in the single fuse address register (FAR) and is then shifted into the separate fuse storage for that memory block, to store on the chip a redundancy allocation signature for each memory block from said built-in self test program; and enabling redundancy for each memory block by interpreting the stored redundancy allocation signature for that memory block.

2. The method of claim 1, wherein the memory blocks are embedded memory blocks connected with logic circuits in an integral manner on the chip.

3. The method of claim 1, including storing the redundancy allocation signature for each memory block in a separate fuse storage comprising a separate fuse latch for that memory block.

4. The method of claim 3, wherein:

memory blockn is tested first by the BIST engine, and the redundancy allocation signature for memory blockn is stored in the single fuse address register and is then shifted into a fuse latch0;

one or more intermediate memory blocks are tested next by the BIST engine, and the redundancy allocation signature for each intermediate memory block is stored in the single fuse address register, and is then shifted to the fuse latch0, and the contents of the fuse latch0 is shifted into an intermediate latch;

memory block0 is tested last by the BIST engine, and the redundancy allocation signature for memory block0 is stored in the single fuse address register and is then shifted into the fuse latch0, the contents of the fuse latch0, which is an intermediate memory block redundancy allocation signature, is shifted into an intermediate fuse latch, and the contents of an intermediate fuse latch, which is the memory blockn redundancy allocation signature, is shifted into the fuse latchn.

5. The method of claim 4, wherein outputs of the fuse latches are masked/prevented from implementing repairs to the memory blocks until testing of all memory blocks is completed.

6. The method of claim 1, including providing each memory block with a plurality of redundant columns of memory cells and redundant rows of memory cells.

* * * * *